United States Patent [19]

Karcher

[11] 4,406,572
[45] Sep. 27, 1983

[54] TRANSFER SYSTEM

[75] Inventor: DeWayne E. Karcher, Glendale, Ariz.

[73] Assignee: Honeywell Information Systems Inc., Phoenix, Ariz.

[21] Appl. No.: 278,254

[22] Filed: Jun. 29, 1981

[51] Int. Cl.³ .................. B65G 57/30; B65G 59/06; B65H 31/08
[52] U.S. Cl. .................................. 414/404; 271/4; 271/212; 414/32; 414/96; 414/130; 414/417
[58] Field of Search .................. 271/4, 6, 180, 212; 414/32, 92, 93, 95, 96, 130, 131, 403, 404, 417

[56] References Cited

U.S. PATENT DOCUMENTS

| 2,595,346 | 5/1952 | Federwitz | 271/212 X |
| 2,749,120 | 6/1956 | Mallory | 271/212 |
| 2,779,592 | 1/1957 | Hartman | 271/4 |
| 2,948,382 | 8/1960 | Russell | 414/95 X |
| 3,049,346 | 8/1962 | Evansen | 271/4 |
| 3,335,699 | 8/1967 | Aiken et al. | 414/32 X |
| 3,513,990 | 5/1970 | Wolle | 414/32 |
| 3,568,860 | 3/1971 | Rawlins | 271/212 X |
| 4,002,560 | 1/1977 | Grantham | 414/80 X |
| 4,068,767 | 1/1978 | Tippetts | 414/32 |
| 4,245,940 | 1/1981 | Luther et al. | 271/212 X |
| 4,331,415 | 5/1982 | Blatz et al. | 414/96 X |

FOREIGN PATENT DOCUMENTS 59531 6/1913 Austria ........................ 271/35

Primary Examiner—Robert B. Reeves
Assistant Examiner—David F. Hubbuch
Attorney, Agent, or Firm—Edward W. Hughes; Wm. W. Holloway, Jr.; L. J. Marhoefer

[57] ABSTRACT

A system for transferring substantially identical fixtures, on each of which is mounted a workpiece, from a stack of said fixtures in a transferor magazine to a transferee magazine. Each of the magazines has substantially planar walls defining a prismatic interior space having a substantially rectangular cross-section and open top and bottom, or end, faces. The walls of the magazine are provided with spring catches for retaining in the storage space fixtures placed therein, with the catches defining that portion of the interior of the magazine constituting a fixture storage space. The transferor magazine is mounted on a transferor base, which is provided with a transferor station and apparatus for placing the catches of the transferor base in a condition so that fixtures in the storage space can descend into the transferor station. The transferee magazine is mounted on a transferee base which is provided with a transferee station. The transferee base is provided with a fixture loader for inserting a fixture positioned in the transferee station into the storage space of the transferee magazine. Apparatus is provided for moving fixtures in sequence from the transferor station to the transferee station. Work stations can be provided between the transferor base and the transferee base where manufacturing and testing operations can be conducted on the workpiece carried by each fixture.

1 Claim, 17 Drawing Figures

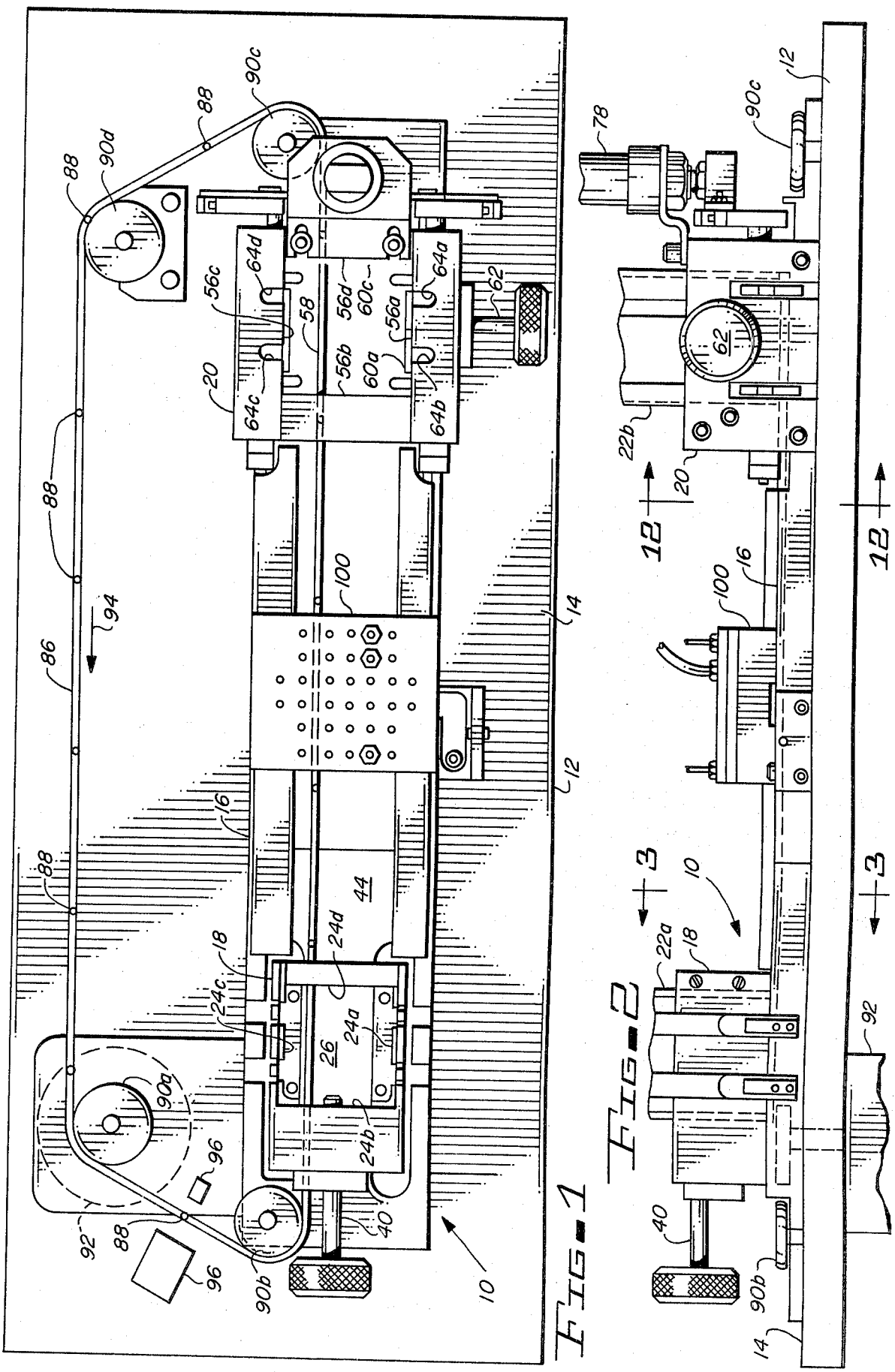

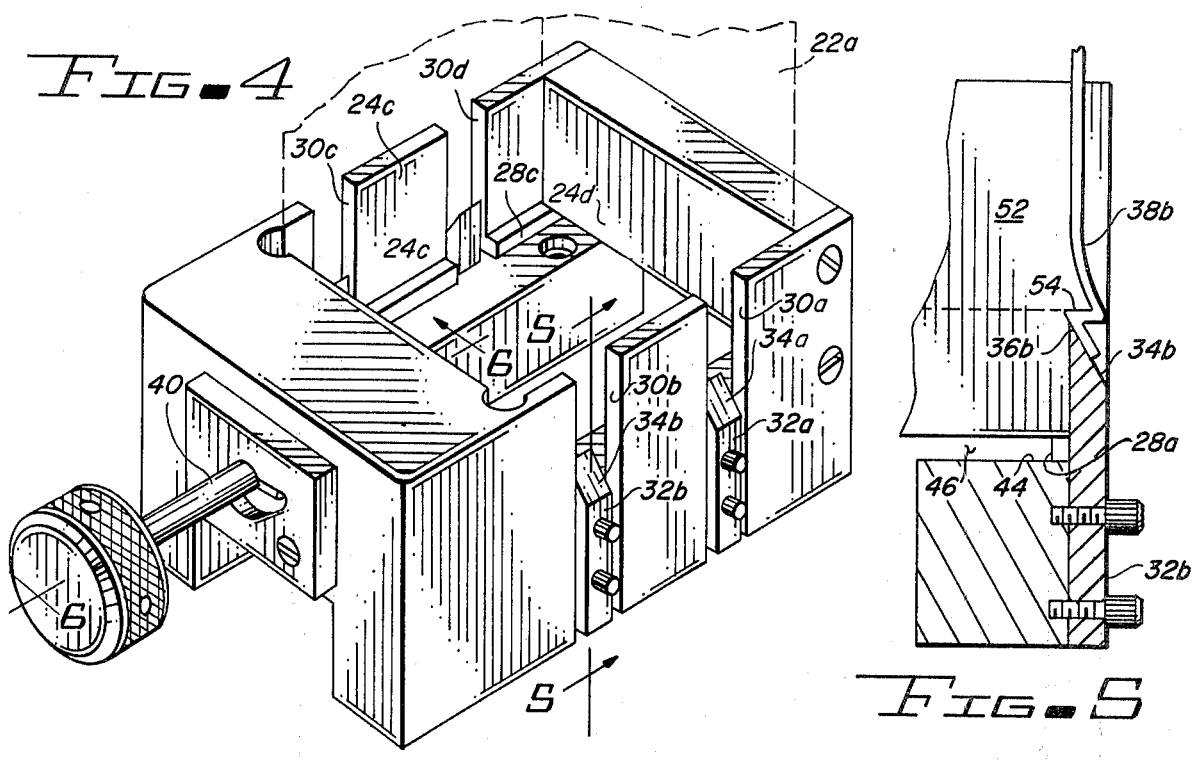
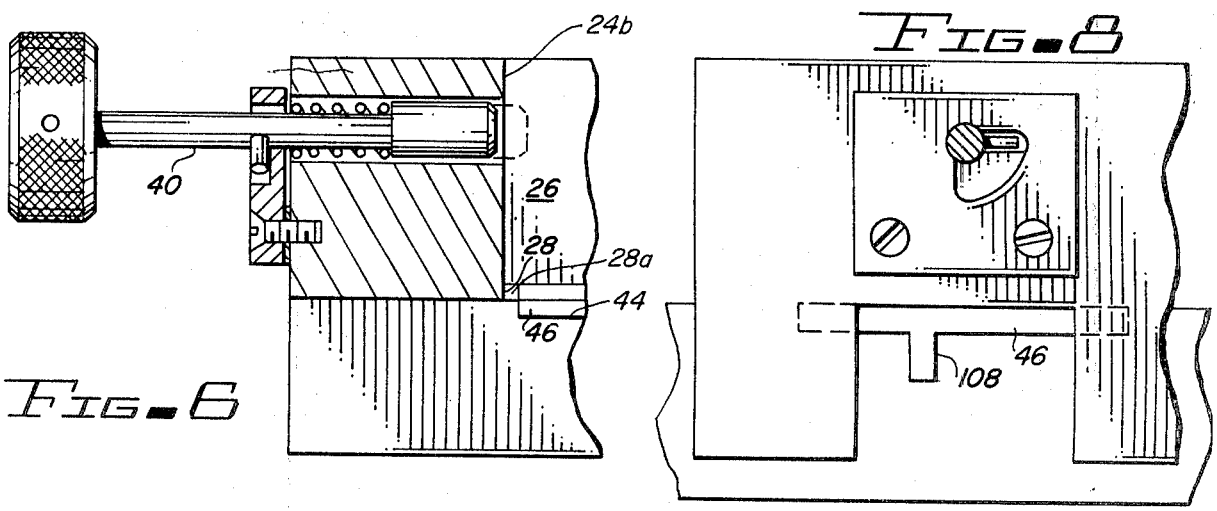
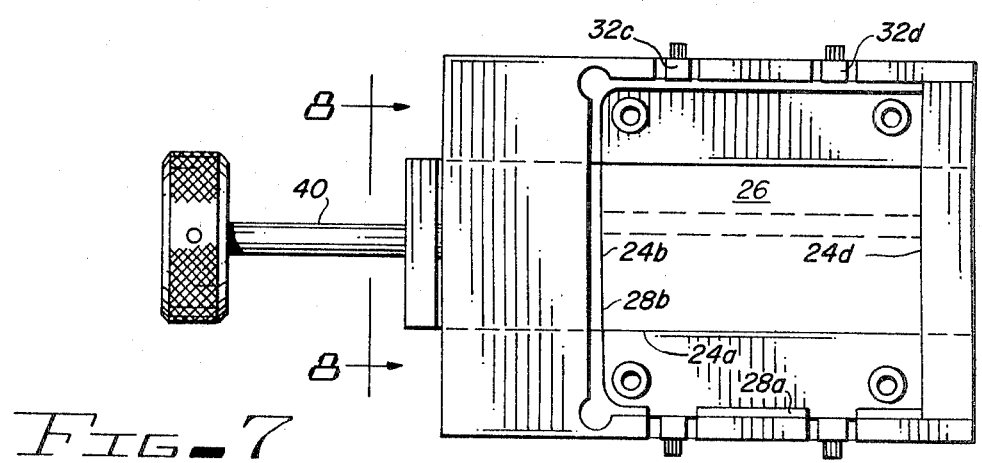

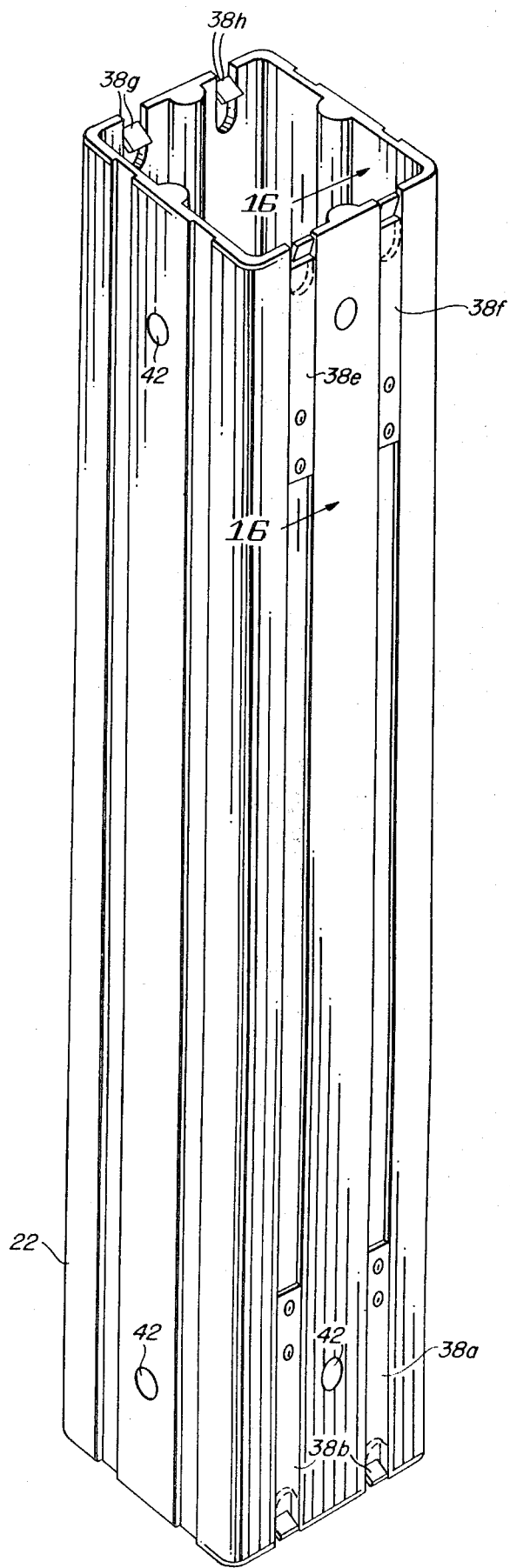
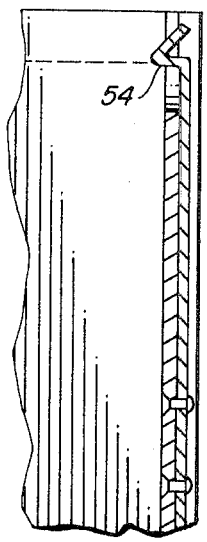
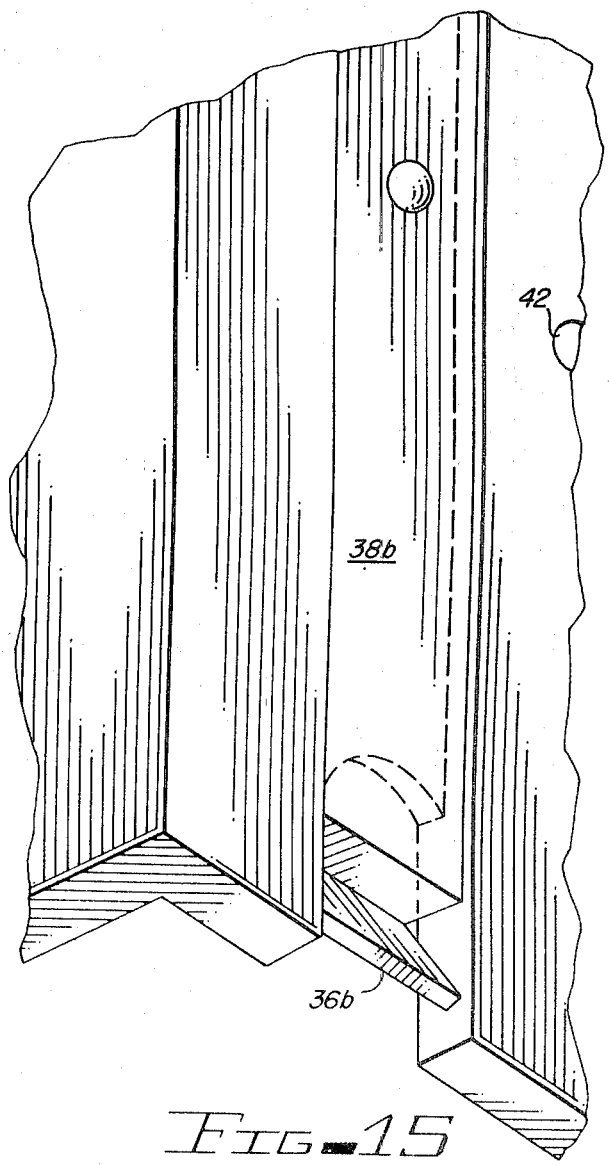
FIG-14
FIG-16
FIG-15 ically identical fixtures with each fixture holding a workpiece from a stack of such fixtures which are held in the storage space of a transferor mag-
TRANSFER SYSTEM

BACKGROUND OF THE INVENTION

1. Field of the Invention

This invention is in the field of manufacturing apparatus and, more particularly, relates to a transfer system for removing fixtures holding a workpiece from the bottom of a stack of such fixtures stored in a transferor magazine and for loading such fixtures and stacking them serially in a transferee magazine. The magazines are removably mounted on their respective bases, and a transport mechanism transports the fixtures from a transferor station in the transferor base to a transferee station in the transferee base where a fixture loader loads fixtures into the transferee magazine a fixture at a time.

2. Description of the Prior Art

The development of integrated circuit (IC) chips, particularly medium and large scale IC chips, has created a need for improved manufacturing processes which lend themselves to automating the connecting of the conductive leads of a lead frame on which an IC chip is bonded to substrates when the IC chips are interconnected to form useful electronic circuits. In implementing such processes, fixtures such as those described and illustrated in U.S. Pat. No. 4,069,496, which issued on Jan. 17, 1978, can be used to removably hold a segment of a film strip on which an IC chip has been bonded to a lead frame, which frame is, in turn, attached to the segment.

In automating the processes of manufacturing hybrid substrates, a plurality of fixtures is assembled, or collected, in a magazine such as that described and illustrated in application Ser. No. 06/153,367 filed May 27, 1980, entitled "Material Handling Apparatus," which application is assigned to the same assignee as this application. Each of the fixtures stored in a magazine such as that disclosed in application Ser. No. 06/153,367 filed May 27, 1980, now U.S. Pat. No. 4,346,817 may have as its workpiece an IC chip bonded to a segment of film held by each fixture. Each such magazine has the capability of having such fixtures inserted into the magazine and subsequently removed as steps in the process of manufacturing electronic circuits.

U.S. Pat. No. 4,068,767, which issued on Jan. 17, 1978, is the closest relevant prior art known to applicant. This patent teaches a transfer mechanism which withdraws a fixture from the bottom of a stack of such fixtures in a transferor magazine and inserts them serially into the bottom of a stack of such fixtures in a second, or transferee, magazine. The transfer mechanism includes a linear actuator which, in cooperation with cam surfaces, loads or inserts fixtures, a fixture at a time, into the transferee magazine.

The transfer system of this invention is designed to use a magazine such as that disclosed in FIGS. 12 through 15 of application Ser. No. 06/153,367, filed May 27, 1980, now U.S. Pat. No. 4,346,817 the disclosure of which is incorporated by reference herein, in performing various manufacturing steps on the workpiece, i.e., the IC chip, mounted on each fixture; such as, testing the chip; providing machine readable identification of the workpiece on the segment of the film strip on which the workpiece is mounted; reading the data so encoded, blanking a chip and its leads from the segment, forming its leads, and mounting a chip and its formed leads on a substrate; removing the segment from which an IC chip has been excised from a fixture, and mounting a segment with a chip mounted thereon on a fixture to repeat the process.

Problems with prior art systems are that they require a linear actuator that limits the flexibility of the transport system with respect to transporting fixtures from the transferor magazine to one or more work stations and ultimately to a transferee magazine and storage therein. Another problem with prior art transfer systems is that the means for loading fixtures into the transferee magazine applies forces to the fixtures and their workpieces which can damage the workpiece mounted on a fixture. Another problem with prior art systems is that they do not permit precise control of intermittent movement of a plurality of fixtures unless the fixtures are in contact with each other.

SUMMARY OF THE INVENTION

The present invention provides a transfer system for transferring substantially identical fixtures with each fixture holding a workpice from a stack of such fixtures which are held in the storage space of a transferor magazine and for loading each such fixture into the storage space of a transferee magazine. The transferor magazine is removably mounted on a transferor base and the transferee magazine is removably mounted on a transferee base. The transferor base is provided with retraction means which open up the lower fixture retention means of the transferor magazine to permit the bottommost fixtures within the transferor magazine to fall into a transferor station formed in the transferor base which station can receive, or accept, one fixture. The transferee base is provided with a transferee station. A fixture loading mechanism is incorporated in the transferee base which mechanism when actuated lifts a fixture positioned in the transferee station past the fixture retention means of the transferee magazine so that the fixture is stored in the fixture storage space of the transferee magazine. A transport system, which includes an endless belt, sequentially moves fixtures from the transferor station to the transferee station normally in a series of substantially equal steps. Control means are provided to control the motion of the transfer mechanism so that, as a fixture is positioned in the transferee station at the completion of a step, the loading mechanism is actuated to load the fixture in the transferee station into the transferee magazine. At the completion of each loading operation of a fixture into the storage space of a transferee magazine, the transport mechanism is actuated, or energized, to advance another fixture one step from the transferor station toward the transferee station. Various types of work stations can be positioned along the fixture guide rails through which the fixtures move from the transferor station to the transferee station so that, as each fixture is substantially properly positioned relative to a work station at the completion of a step, a manufacturing operation can be performed on the workpiece mounted on that fixture. At the conclusion of the manufacturing operation at a given work station, the fixture is advanced one step. Ultimately, each fixture in a transferor magazine can be advanced to the transferee station where each fixture is loaded sequentially into the transferee magazine.

It is, therefore, an object of this invention to provide an improved transfer system for fixtures adapted to hold a workpiece which is reliable and minimizes the risk of damage to a workpiece mounted on each fixture.

It is another object of this invention to provide a transfer system for fixtures which will advance the fixtures intermittently, or in steps, with no direct contact between fixtures to one or more work stations where various manufacturing or testing operations can be performed on the workpiece and ultimately to a transferee station where each fixture is loaded in sequence into a transferee magazine.

It is yet another object of this invention to provide a transferee system for fixtures in which the fixtures are loaded into the transferee magazine with a minimum of distorting force being applied to the fixture and thus to any workpiece mounted thereon.

BRIEF DESCRIPTION OF THE DRAWINGS

Other objects, features and advantages of the invention will be readily apparent from the following description of the preferred embodiment taken in conjunction with the accompanying drawings, although variations and modifications may be affected without departing from the spirit and scope of the novel concepts of the disclosure and in which:

FIG. 1 is a plan view of the transfer system of this invention;

FIG. 2 is a side elevation of the transfer system;

FIG. 4 is a perspective view of the transferor station;

FIG. 5 is an enlarged partial section taken on line 5—5 of FIG. 4;

FIG. 6 is an enlarged partial section taken on line 6—6 of FIG. 4;

FIG. 7 is a plan view on a reduced scale of the transferor base;

FIG. 8 is a section taken on line 8—8 of FIG. 7;

FIG. 14 is an isometric view of a magazine;

FIG. 15 is a fragmentary enlarged perspective of the details of a spring catch of the magazine of FIG. 13; and FIG. 16 is an enlarged fragmentary section taken on line 16—16 of FIG. 14.

DETAILED DESCRIPTION OF THE INVENTION

Figure 3:
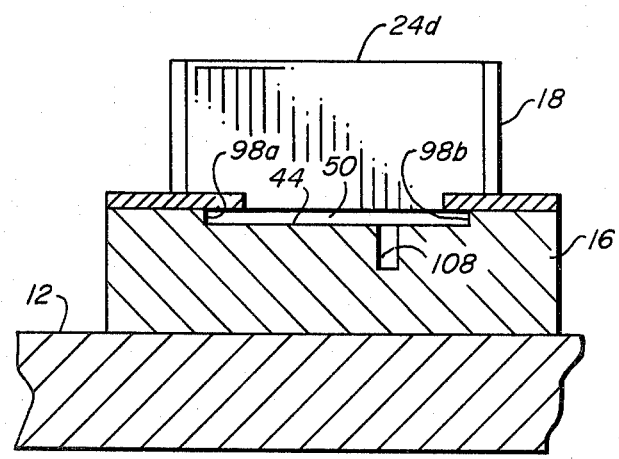
FIG. 3 is a section taken on line 3—3 of FIG. 2.

In FIGS. 1 and 2, transfer system 10 has a support plate, or support member 12, the top surface 14 of which defines a reference plane. Fixture guide rail 16 is mounted on top surface 14, and transferor base 18 and transferee base 20 are mounted on, or are secured to, guide rail 16 and plate 12. Transferor magazine 22a and transferee magazine 22b are removably positioned in tranferor base 18 and transferee base 20, respectively. Additional details of magazines 22 are illustrated in FIGS. 14 through 16. Walls 24a, b, c and d of transferor base 18 define a magazine receiving space 26 within which either end of a magazine 22 can fit, or be inserted. Ledges 28a, b, c on sides 24a, b and c of magazine 22a, as is best illustrated in FIG. 7, limit the extent to which magazine 22a can enter into the space 26 of transferor base 20. Slots 30a, b, c and d are formed in walls 24a and 24c. Positioned in slots 30a, b, c and d are spring retractors 32a, b, c and d, each of which is provided with a cam surface 34a, b, c and d that engage corresponding cam surfaces 36a, b, c and d of the spring catches 38a, b, c and d, the fixture retention means, of tranferor magazine 22a. Details of magazines 22 and their retention means 38a through h are illustrated in FIGS. 14, 15 and 16. Magazines 22 are more fully described in U.S. Patent Application Ser. No. 06/153,367, filed May 27, 1980, now U.S. Pat. No. 4,346,817, and are best illustrated in FIGS. 12 through 15 thereof.

Figure 13:
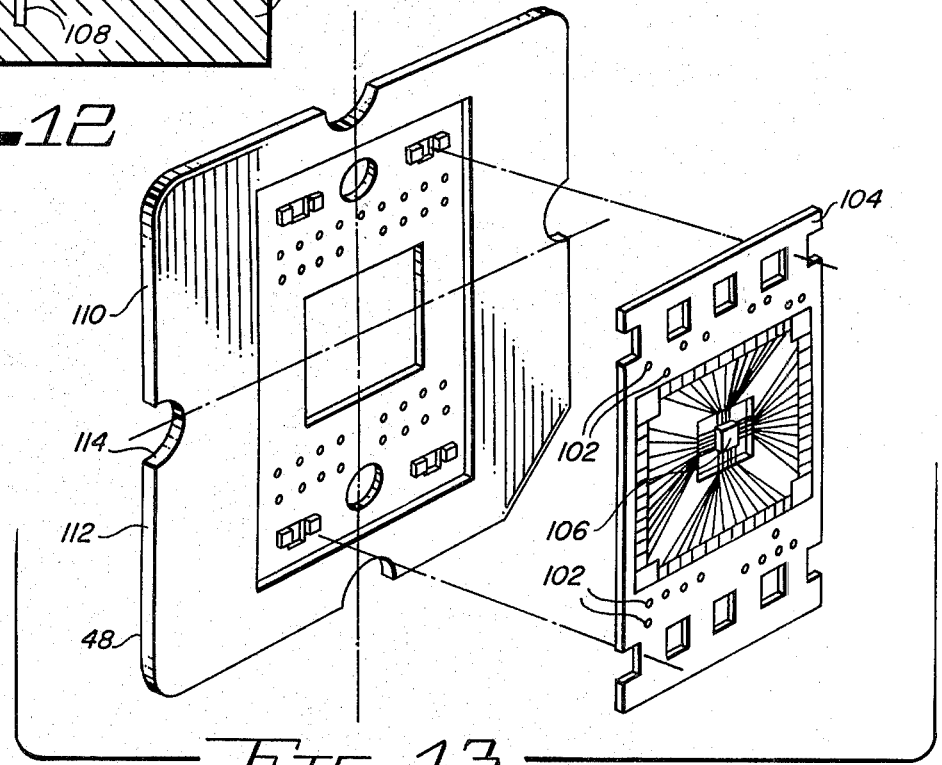
FIG. 13 is an isometric view of a reusable fixture with a segment of a film strip exploded therefrom at an enlarged scale.

Tranferor magazine 22a is removably positioned, or held, in transferor base 18 by spring actuated detent 40, as is best seen in FIG. 6. Detent 40 fits into one of the recesses 42, circular openings formed in each end of the four walls of magazine 22, for example. The space defined by ledges 28a, b, and c and the top surface 44 of guide rail 16 forms transferor station 46 for a fixture 48, which is illustrated in FIG. 13. Fixtures 48 are more fully described and illustrated in U.S. Pat. No. 4,069,496, which issued on Jan. 17, 1978. Wall 24d and top surface 44 of guide rail 16 define an exit opening 50 for transferor station 46. The height of opening 50 is such as to permit only one fixture 48 to pass through it at a time.

As is best illustrated in FIG. 5, as one end of the magazine 22a is inserted into magazine receiving space 26 of transferor base 18, cam surfaces 36 of the fixture retention means 38 of magazine 22a at the lower end of magazine 22a will contact the cam surfaces 34 of the corresponding spring retractor 32 of base 18, which forces each of the spring retention means 38 into the position, or condition, illustrated in FIG. 5. In this position, or condition, retention means 38 of magazine 22a no longer blocks, or prevents, the fixtures 48 positioned in storage space 52 of magazine 22a from moving freely downward so that the bottommost fixture 48 may move, or fall, into tranferor station 46. Since each magazine 22 has fixture retention means 38 at each end thereof, the catch surfaces 54 of each of the spring retention means 38 define the storage space 52 of a magazine 22.

Transferee base 20, which is also mounted on fixture guide rail 16 and plate 12, is provided with walls 56a, b, c and d, which define a transferee magazine receiving space 58 within which either end of tranferee magazine 22b can be inserted. Details of transferee base 20 are best illustrated in FIGS. 9 through 12. Ledges 60a, b, and c on walls 56a, c and d limit the extent to which one end of transferee magazine 22b can be inserted into space 58 of transferee base 20. Spring actuated detent 62 of transferee base 20 is structurally and functionally substantially identical to spring actuated detent 40 of transferor base 18 and likewise cooperates with one of the recesses, or openings, 42 in the walls of transferee magazine 22b to removably secure magazine 22b in transferee base 20. Walls 56a and c are provided with recesses 64a, b, c and d, within which the retention means 38 of transferee magazine 22b may be displaced while a fixture 48 is being loaded into the tranferee magazine 22b by the fixture loading means of transferee base 20, as will be described below. Ledges 60a, b and c and the top surface 44 of guide rail 16 define a transferee fixture station 66. A fixture 48 located in transferee fixture station 66 is properly positioned to be loaded into the storage space 52 of transferee magazine 22b by the fixture loading means of base 20. Wall 56b of transferee base 20 and the top surface 44 of guide rail 16 define an entrance 67 to station 66.

Figure 11:
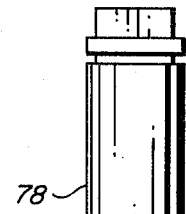
FIG. 11 is a side elevation of a transferee station.
Figure 12:
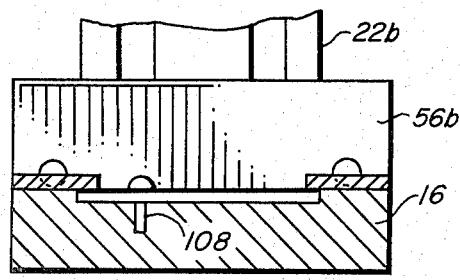
FIG. 12 is a section taken on line 12—12 of FIG. 2.
Figure 9:
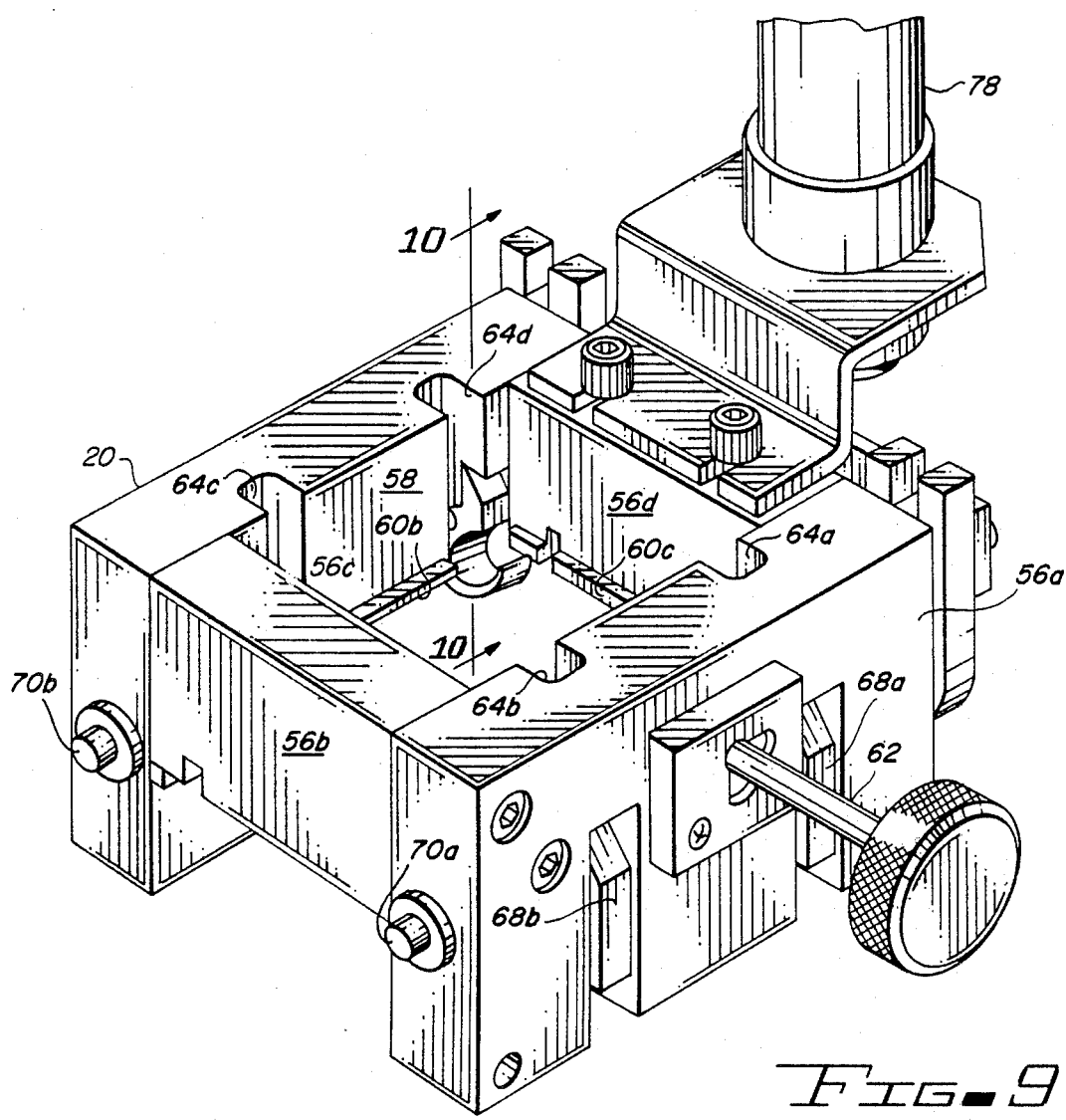
FIG. 9 is a perspective view of the transferee station.
Figure 10A:
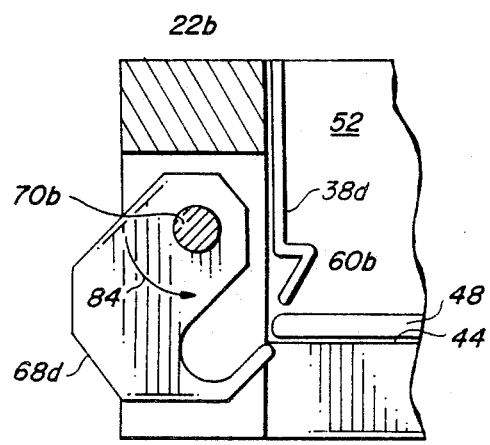
FIG. 10A is a partial section taken on line 10—10 of FIG. 9.
Figure 10B:
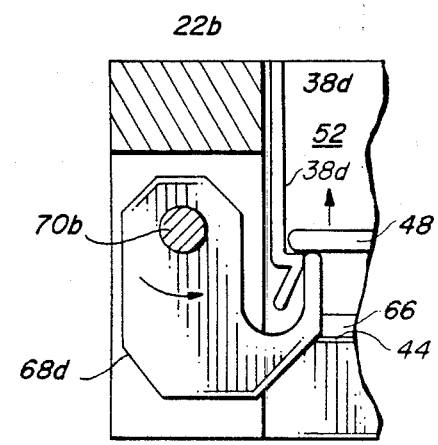
FIG. 10B is a view similar to 10A showing the lifting finger of FIG. 10A in a second position.

The fixture loading mechanism of transferee base 20, as best illustrated in FIGS. 10 and 11, consists of four piviotally mounted fingers 68a, b, c and d which are mounted on shafts 70a, and b. Secured to each shaft 70a, b is a pivot arm 72a, 72b. Actuator bar 74 is mounted on the piston rod 76 of a double acting pneumatic cylinder 78. Cam followers 80a, b are mounted on bar 74 so that they move in the slots 82a and 82b formed in the pivot arms 72a, b to convert linear movement of bar 74 into rotary, or oscillatory angular, motion of shafts 70a and 70b. In FIG. 10a, the position of finger 68d prior to actuator 78 moving bar 74 downwardly is illustrated, together with the position of a fixture 48 which is located in transferee station 66. Rotation of shaft 70b in the direction illustrated by arrow 84 lifts fixture 48 upwardly and causes the retention means 38d of transferee magazine 22b to be moved aside into recess 64d of wall 56c of transferee base 20 so that fixture 48 can be loaded, or inserted, into the storage space 52 of magazine 22b as illustrated in FIG. 10B. After actuator 78 has moved bar 74 downwardly the maximum extent and all the fingers 68 are in the position of finger 68d as illustrated in FIG. 10B, actuator 78 is then energized to retract bar 74 and return the lifting fingers 68 to their initial position, as illustrated in FIG. 10A. It should be noted as seen in FIGS. 1 and 9 that loading fingers 68a, b, c and d are positioned so that they substantially contact the corners of a fixture 48 located in transferee station 66.

The mechanism for transporting fixtures 48 from transferor station 46 of transferor base 18 to transferee station 66 in transferee base 20 is, in the preferred embodiment, a continuous plastic timing chain cable 86, which is provided with a plurality of drive pins 88, which pins 88 are spaced substantially uniformly along the length of cable 86. The distance between adjacent pins 88 is slightly greater than the width of substantially square fixtures 48. In the preferred embodiment, each fixture 48 is substantially a 2-inch square. Chain 86 is positioned on 4 sprockets 90a, b, c and d. Sprockets 90a and 90d are mounted on plate 12 and sprockets 90b and c are mounted on fixture guide rail 16 as seen in FIGS. 1 and 2. Sprocket 90a is mounted on the shaft of motor 92 and is driven by motor 92 to cause chain 86 to move in the direction of arrow 94. Drive pin sensing means 96 in the preferred embodiment senses each time a drive pin 88 occupies a predetermined position relative to the sensing means 96. Drive sensing means 96 can be used to stop motor 92, which stops chain 86, and any fixture 48 being moved by a pin 88 along the fixture guide rail 16. Typically, drive chain 86 will be advanced by drive motor 92 a distance equal to the space between adjacent drive pins 88, substantially three inches in the preferred embodiment. Typically, transfer system 10 is designed so that, when chain 86 is stopped, a pin 88 is about to contact, or is in close proximity to, a fixture 48 positioned in transferor station 46 of transferor base 18. Similarly, chain 86 will be stopped each time a fixture 48 is substantially properly positioned in, or loaded into, transferee station 66. Drive pin sensor means 96, which may be a conventional light emitting diode and a sensing phototransistor, or a mechanical contact operating a microswitch, will stop the electrical energization and thus the rotation of motor 92 for a predetermined delay, and will energize pneumatic actuator 78 to load a fixture 48 positioned in transferee station 66 into the storage space 52 of transferee magazine 22 during the delay period. After the predetermined delay, sensing means 96 will re-energize motor 92 and cause pneumatic actuator 78 to return to its initial position or condition where the lifting fingers 68 are all in the position illustrated in FIG. 10A.

Fixture guide rail 16 is provided with slots 98a, b, through which a fixture 48 may slide. Slots 98a, b, prevent any fixture 48 located therein from turning, or twisting, to any significant degree while being moved along guide rail 16. Slots 98a, b, thus, prevent any fixture 48 from becoming jammed, or locked, in place, and thus stopping the operation of the transport mechanism. The distance, or space, between transferor base 18 and transferee base 20 can be made relatively long, so that several work stations, such as work station 100 which is illustrated in FIGS. 1 and 2, may be located between bases 18 and 20 on guide rail 16.

Work station 100 illustrated in FIGS. 1 and 2 is one that can read coded indicia holes 102 formed in film segment 104 on which workpiece 106 is carried by fixture 48 as illustrated in FIG. 13. The coded indicia holes in segment 104 can be used to identify the lot number, the type, and the quality of workpiece 106. More than one work station 100 can be provided along guide rail 16 so that more than one function, or operation, can be performed on a workpiece 106, an IC chip, for example, carried by each fixture 48 as each fixture 48 is moved from transferor station 46 to transferee station 66. The fixtures 48 are unloaded serially from the bottom of a stack of such fixtures 48 in transferor magazine 22a in base 18, and move in a series of steps along guide rail 16 to transferee station 66, where they are loaded into the storage space 52 of magazine 22b mounted in transferee base 20.

Fixture guide rail 16 is, in the preferred embodiment, made of several plates of aluminum which have a cross-section such as that illustrated in FIG. 3. Grooves 98a, b retain the fixtures 48 within rail 16 as the fixtures are advanced, or slide, within grooves 98, from transferor station 46 to transferee station 66. Guide rail 16 also serves as a mount for bases 16, 18, one or more work stations 100, and pulleys 90b, 90c. Each fixture 48 in the guide rail 16 is moved by contact with a drive pin 88 of chain 86. Fixture guide rail 16 also has a chain guide recess 108 through which the chain 86 moves. Chain guide recess 108 prevents the portion of chain 86 positioned therein from twisting as it moves through guide rail 16 with the pins 88 of that portion moving fixture 48 along guide rail 16. As a result, the drive pins 88 are always substantially vertical while traversing guide rail 16. Chain guide recess 108 is not centered in surface 44 or with respect to the fixtures 48, the reason being that it is preferable to have each pin 88 contact a straight portion 110 of a side 112 of fixture 48, for example, instead of one of the notches 114.

In operation, the storage space 52 of transferor magazine 22a is occupied by a plurality of fixtures 48, each of which normally is provided with a workpiece 106. Transferor magazine 22a is removably mounted on transferor base 18. Positioning magazine 22a on transferor base 18 causes the retention means 38 of magazine 22a to be displaced by corresponding spring retractors 32 so that the fixtures 48 in storage space 52 of transferor magazine 22a are free to descend, or fall into transferor station 46, with the lowermost fixture 48 being positioned in transferor station 46. Typically, an initially empty transferee magazine 22b is positioned on transferee base 20. When the two magazines 22a and 22b are in position and work station 100, for example, is ready to function, motor 92 of the transport subsystem of transfer mechanism 10 is energized by manually closing a conventional starter switch which is not illustrated. When energized motor 92 rotates sprocket wheel 90a, causing chain 86 to advance, or move in the direction of arrow 94 until a pin 88 intersects the narrow light beam produced by the photodiode of the drive pin sensing means 96 to de-energize and stop motor 92. The distance motor 92 advances chain 86 each time it is energized is typically the distance between two adjacent drive pins 88. Sensing means 96 is positioned so that when motor 92 is de-energized and chain 86 stops, a drive pin 88 is in close proximity to a fixture 48 in transferor station 46 of transferor base 18. When motor 86 is again energized, it will advance chain 86 in the direction of arrow 94 a distance of one step, equal to the distance between adjacent pins 88, three inches in the preferred example. Each such step will move a fixture 48 out of the transferor station 46 and permit the next adjacent fixture 48 in the stack of such fixture in magazine 22a to drop into transferor station 46. Each time chain 88 is moved one unit, or step, it is stopped by the pin sensor 96.

Sensor 96, when it detects a pin 88, not only stops the motor 92, but will also cause actuator 78 to be energized for a complete cycle of operation, during which the lifting, or loading, fingers 68 of transferee base 20 are rotated. During each such cycle of operation of the fingers 68, any fixture 48 located in transferee station 66 will be lifted into and placed in storage space 52 of magazine 22b. Since there are several units of distance, or steps, between transferor base 18 and transferee base 20, with the length of each step being equal to the distance between adjacent pins 88 of plastic timing chain cable 86, the number of times that chain 80 is advanced, or steps, until the first fixture 48 reaches transferee station 66 depends, of course, upon the distance between base 18 and base 20. At any location, or station, on fixture guide rail 16 where a fixture 48 is positioned between transferor base 18 and transferee base 20 at the completion of each step, a work station 100, for example can be located which can perform a testing or manufacturing operation on a workpiece 106 carried by such fixture 48. After a fixture 48 is loaded, or inserted, into the transferee station 66, each fixture 48 is loaded into the storage space 52 of transferee magazine 22b. In the preferred embodiment, this occurs each time drive pin detector 96 detects the passage of a pin 88. Each time detector 96 detects a pin 88, detector 96 will stop motor 92, cause, or enable, actuator 78 to go through a cycle of operation, and, after the cycle of operation of actuator 78 is completed, or, after a predetermined delay, will cause motor 92 to be again energized to advance chain 86 another step.

While in the preferred mode, chain 86 is advanced a step, or increment, at a time, if transfer system 10 is being used only to unload fixtures 48 from transferor magazine 22a and to load them into transferee magazine 22b, or where a testing or manufacturing operation can be performed without the necessity for stopping fixtures 48; motor 92 can be energized continuously and sensor 96 would then be used, for example, only to cause, enable, or control actuator 78 to complete a cycle of operation each time a pin 88 is detected by sensor 96 which would also be substantially at the same time that a fixture 48 is loaded into the transferee station 66.

From the foregoing, it is obvious that this invention provides an improved means for transferring fixtures from a magazine of the type that is open at each end from a transferor station in a transferor base to a transferee station in a transferee base, and for loading the fixtures so transferred into the storage space of a transferee magazine positioned on the transferee base. Both the transferor and transferee magazines are substantially identical. The loading mechanism of the transferee base has the advantage that it applies the forces necessary to insert a fixture into the storage space of the transferee magazine to the corners of each fixture which reduces the stresses applied to any workpiece mounted on the fixture by such a loading operation. An advantage of the transfer system of this invention is that it makes it possible to automate many of the manufacturing processes, or steps, needed to manufacture hybrid circuits with the fixtures and their workpieces being stored in and protected by magazines 22 except when they are being conveyed from one magazine to another.

What is claimed is:

1. A transfer system comprising:

a transferor magazine and a transferee magazine, each of said magazines having substantially planar walls defining a prismatic interior space having a substantially rectangular cross-section and open top and bottom faces, the walls of each of said magazines having a plurality of spring catches mounted at each end proximate the open top and bottom faces thereof, each of said catches having a first and a second condition, said spring catches defining a fixture storage space within each magazine, said spring catches in their first condition retaining fixtures within the fixture storage space and permitting fixtures to be inserted into the fixture storage space, and, in their second condition, permitting fixtures positioned in the storage space to move out of the fixture storage space;

a transferor base having a fixture transferor station;

a transferor magazine removably mounted substantially vertically on said transferor base, said transferor base having means for placing the spring catches proximate the bottom face of the transferor magazine in their second condition so that fixtures in the storage space thereof descend into the transferor station;

a transferee base having a transferee station, a transferee magazine removably mounted substantially vertically on the transferee base, the spring catches proximate the bottom face of the transferee station being in their first condition, four loading fingers pivotally mounted on said transferee base, actuator means when activated for rotating said loading fingers to cause a fixture in the transferee station of the transferee base to be lifted past the spring catches of the transferee magazine mounted thereon and into the storage space of the transferee magazine, said spring catches retaining each of said fixtures so loaded into the transferee magazine in the fixture storage space thereof;

transport means including an endless chain cable provided with driving pins for positively moving each fixture from the transferor station to the transferee station; and means for activating the actuator means when a fixture is positioned in the transferee station by the transport means.

* * * * *